(12) United States Patent
Venkata

(10) Patent No.: US 8,351,272 B2
(45) Date of Patent: Jan. 8, 2013

(54) APPARATUSES AND METHODS TO REDUCE POWER CONSUMPTION IN DIGITAL CIRCUITS

(75) Inventor: Harish N. Venkata, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 221 days.

(21) Appl. No.: 12/830,151

(22) Filed: Jul. 2, 2010

(65) Prior Publication Data

US 2012/0001682 A1 Jan. 5, 2012

(51) Int. Cl.
*G11C 11/34* (2006.01)

(52) U.S. Cl. .......... 365/185.23; 365/230.06; 365/189.05

(58) Field of Classification Search ............. 365/185.23, 365/230.06, 189.05, 205, 207, 189.11, 185.18, 365/185.33, 189.09, 227

See application file for complete search history.

(56) References Cited

U.S. PATENT DOCUMENTS

| | | | | |
|---|---|---|---|---|
| 5,513,146 | A * | 4/1996 | Atsumi et al. | 365/185.23 |
| 5,798,915 | A * | 8/1998 | Thomsen | 363/60 |
| 6,512,705 | B1 | 1/2003 | Koelling et al. | |
| 6,750,639 | B2 * | 6/2004 | Harrison | 323/281 |
| 7,450,429 | B2 * | 11/2008 | Daga | 365/185.23 |
| 7,929,367 | B2 * | 4/2011 | Yoo et al. | 365/222 |
| 2005/0030819 | A1 * | 2/2005 | Koelling et al. | 365/230.03 |

* cited by examiner

*Primary Examiner* — Dang Nguyen
(74) *Attorney, Agent, or Firm* — Dorsey & Whitney LLP

(57) ABSTRACT

An apparatus and method for reducing power consumption in digital circuits, particularly circuits including a charge pump. A driver may selectively drive a signal line, such as a memory device wordline, between a first voltage, which may be a voltage generated by the charge pump, and a different second voltage. A coupling circuit may be coupled between the signal line and the charge pump to selectively couple the signal line to the charge pump responsive to the signal line being driven from the first voltage to the second voltage. For example, the first voltage may be a voltage generated by the charge pump, and the second voltage may be a voltage having a lesser magnitude. As a result, the voltage on the signal line may be discharged into the charge pump when the voltage of the signal line transitions from the first voltage to the second voltage.

23 Claims, 3 Drawing Sheets

APPARATUSES AND METHODS TO REDUCE POWER CONSUMPTION IN DIGITAL CIRCUITS

TECHNICAL FIELD

Embodiments of this invention relate to semiconductor circuits, and, more particularly, to methods and apparatuses for reducing power consumption of such circuits particularly where they are powered by a charge pump.

BACKGROUND OF THE INVENTION

Semiconductor circuits are commonly powered by a variety of means. In some cases, the circuits are powered solely from an external source coupled to a power supply terminal. However, in other cases, one or more voltages having a magnitude and/or polarity that is different from the magnitude and polarity of a voltage supplied to the circuit may be needed. One common technique for providing such voltages is through use of an internal circuit known as a charge pump. An advantage of using a charge pump is that it may be configured to supply a voltage having a magnitude that is greater than the magnitude of an external supply voltage powering the charge pump. Furthermore, it may be configured to supply a voltage that alternatively or additionally has a polarity that is different from the polarity of the external supply voltage. However, one disadvantage of using a charge pump is that they often may have somewhat limited efficiency. As a result, power may be undesirably wasted in converting one voltage to another voltage having a different magnitude or polarity.

The relative inefficiency commonly encountered with charge pumps makes it all the more important to use the power generated by charge pumps as efficiently as possible. For example, using power in a circuit having an efficiency of only 80% may result in an effective efficiency of only 64% if the circuit is supplied with power by a charge pump also having an efficiency of 80%.

Power is commonly consumed in semiconductor circuits in a variety of situations. One situation that commonly consumes power is transitioning a signal line from one binary voltage to another. For example, signal lines are commonly driven by an inverter having two complementary transistors coupled in series between two supply voltages. An output signal line may then be coupled to the transistors at a node where they are coupled to each other. The line normally transitions from one voltage to another by turning OFF one of the transistors while the other transistor is being turned ON. During this transition, both transistors are often partially conductive at the same time so that current flows from one supply voltage to the other, thereby consuming significant power. The power consumption could be avoided by turning one transistor OFF before starting to turn the other transistor ON, but doing so would increase the time required to transition the signal line from one voltage to the other. Insofar as high switching speed may be very important, this power saving alternative may not be practical in many situations.

Another phenomena that commonly consumes power when transitioning of a signal line from one binary voltage to another results from the capacitive nature of many signal lines. Signal lines, particularly long signal lines, may have substantial capacitance, which allows them to store substantial charge. This charge should be dissipated in order to transition the signal line from one voltage level to another. For example, if the signal line is driven to a first supply voltage $V_{CC}$, sufficient current should be provided to charge the signal line to that level. If the signal line is subsequently discharged to a second supply voltage, such as ground potential, the signal line may be discharged to that level. Thus, each charge and discharge cycle may effectively result in current flowing from $V_{CC}$ to ground, thereby consuming power.

Power may also be consumed in other ways by a wide variety of digital circuits. Yet, to the extent possible, it would be desirable to minimize power consumption in semiconductor circuits, particularly where the semiconductor circuits are powered by a charge pump.

DETAILED DESCRIPTION

Figure 1:
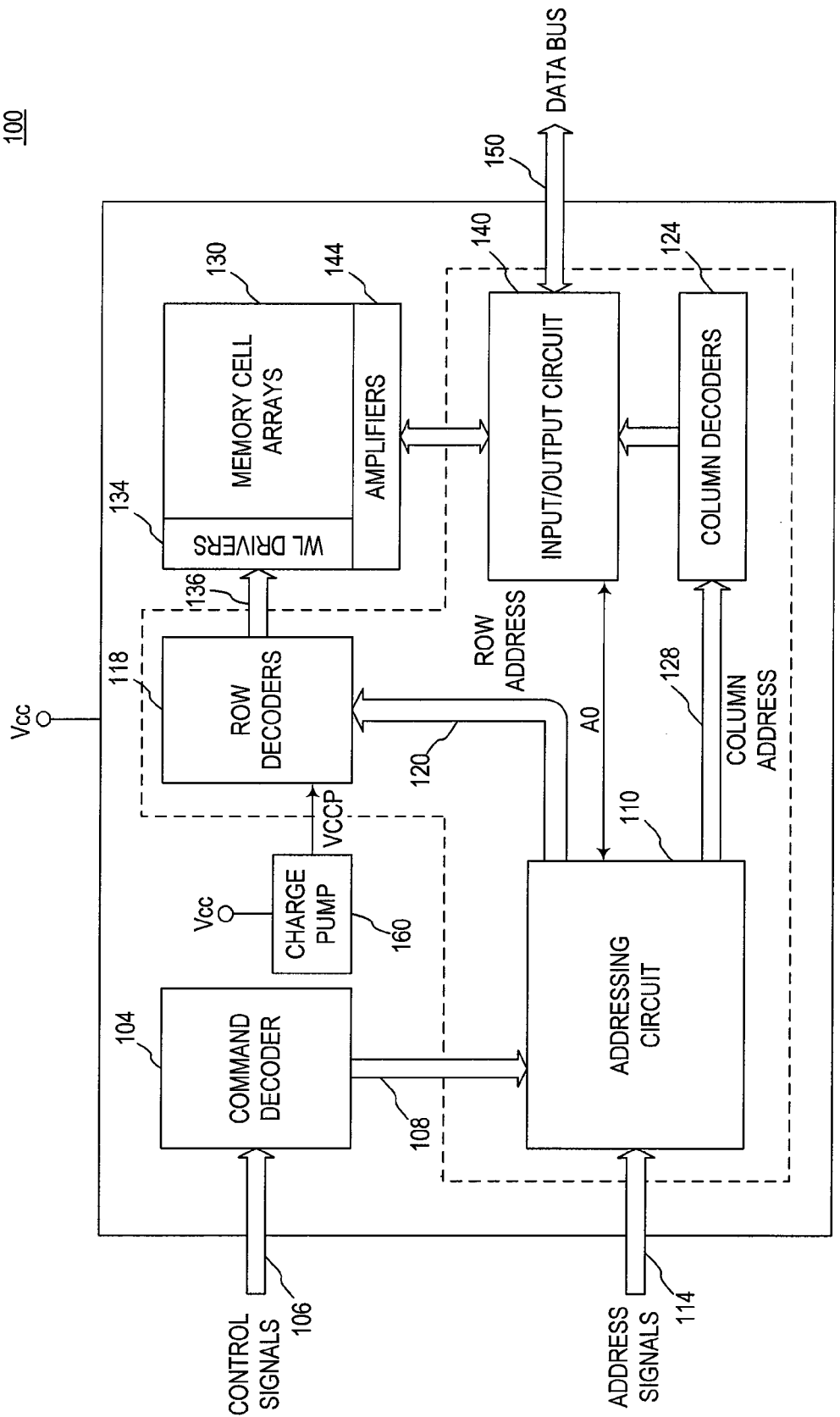
FIG. 1 is a block diagram of a semiconductor memory device according to one embodiment.

One common type of semiconductor device that typically includes a large number of signal lines transitioning between binary voltages are semiconductor memory devices. A semiconductor memory device 100 according to one embodiment is shown in FIG. 1. The memory device 100 embodiment may be dynamic random access memory ("DRAM") device, although other embodiments may be other types of memory devices or semiconductor devices other than memory devices. With reference to FIG. 1, the semiconductor memory device 100 may include a command decoder 104 that may receive various command signals through a command bus 106 and output corresponding control signals on an internal bus 108. The command decoder 104 may also provide other control signals to other components through respective signal lines or buses (not shown). The command signals received by the command decoder 104, may be, for example, a chip select (CS*) signal, a RESET signal, a row address strobe (RAS) signal, a column address strobe (CAS) signal, and a write enable (WE*) signal, to name a few. Other memory device and memory devices other than DRAM devices may receive other types of signals, and integrated circuits other than memory devices may receive signals of an entirely different nature.

The memory device 100 may also include an addressing circuit 110 that may receive address signals, such as row address and column address signals, through an address bus 114. The addressing circuit 110 may decode the address signals to provide row address signals to row decoders 118 via an internal row address bus 120, and column address signals to column decoders 124 via an internal column address bus 128. The row addresses may select respective rows of memory cells in a memory cell array 130, and the column addresses may select respective columns of the memory cells in the array 130. Each row of memory cells in the array 130 may be selected by providing decoded row address signals to wordline drivers 134 via a bus 136. As explained in greater detail below, the wordline drivers 134 may then activate a respective wordline extending through the array 130. As is well-known in the art, the wordline drivers 134 may apply voltages to the wordlines having a magnitude that is greater than the magnitude of a supply voltage $V_{CC}$ applied to the memory device 100 from an external source (not shown). A voltage of this magnitude may be desired so that memory cell access transistors (not shown) may apply the full magnitude of the supply voltage $V_{CC}$ to respective memory cells. Insofar as the wordline drivers 134 may drive the wordlines with voltages that are greater than $V_{CC}$, the wordlines drivers 134 may be supplied with power at a voltage that is greater than $V_{CC}$. For this purpose, a charge pump 160 may receive the supply voltage $V_{CC}$ and output a first voltage, such as a pumped voltage $V_{CCP}$, to the wordline drivers 134. As discussed above, the charge pump 160 may not be as efficient as desired so that significantly more power may be supplied to the charge pump than the charge pump is able to deliver to the wordline drivers. For this reason, it may be desirable for the combination of the wordline drivers 134 and the charge pump 160 to consume as little power as possible.

Each column of memory cells in the array 130 may be selected by providing decoded column address signals to an input/output circuit 140, which, in turn, may drive corresponding sense amplifiers 144. Each of the sense amplifiers 144 may be coupled to a corresponding column of memory cells.

When a row and column of memory cells are selected by respective row and column address signals, write data may be coupled to the array 130 through a data bus 150, the input/output circuit 140 and the sense amplifiers 144. When a row and column of memory cells are selected by respective row and column address signals for a read operation, read data may be coupled from the array 130 to the data bus 150 through the sense amplifiers 144 and the input/output circuit 140.

Figure 2:
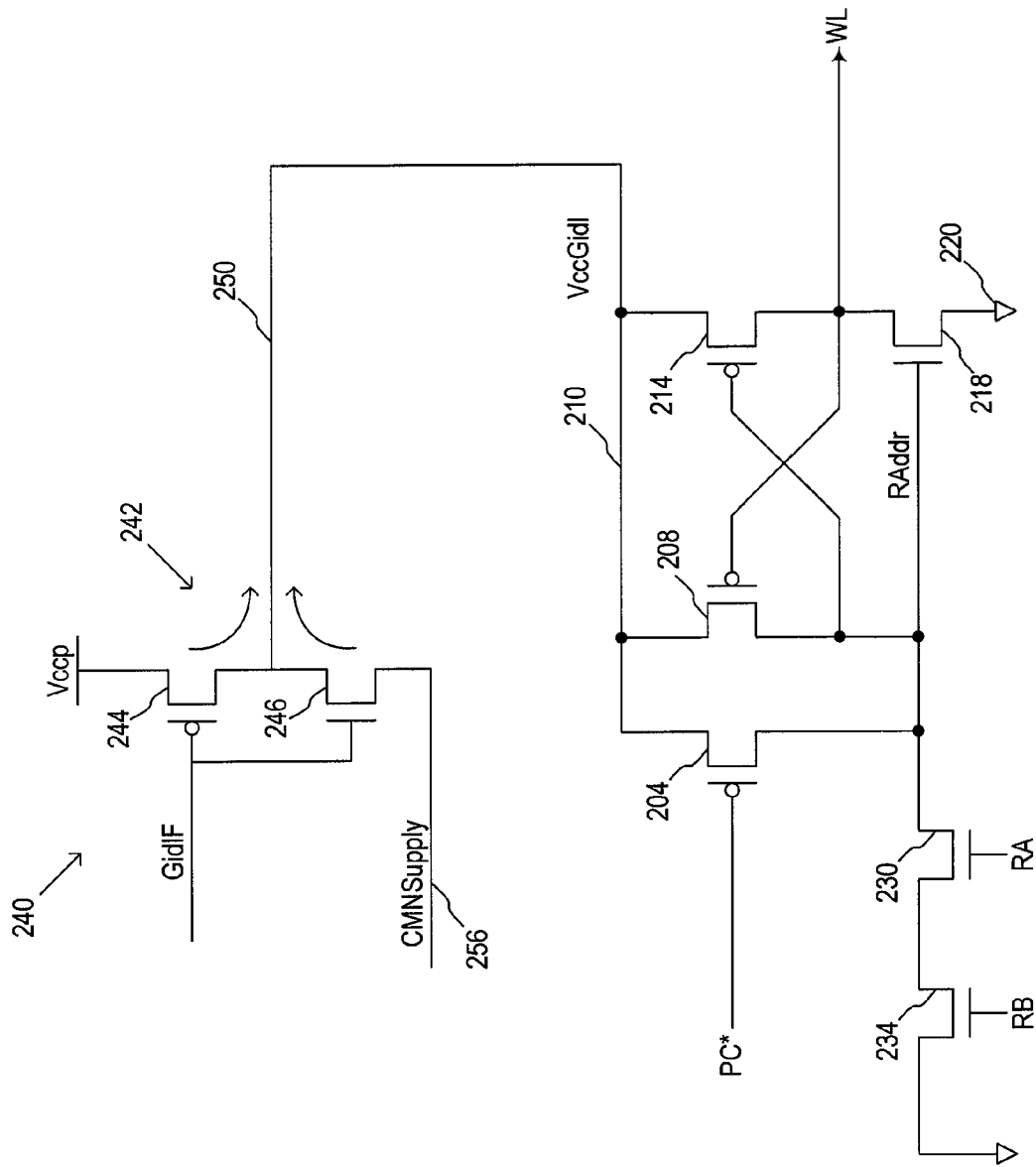
FIG. 2 is a schematic diagram of an embodiment of a wordline driver that may be used in the memory device of FIG. 1.

An embodiment of a wordline driver 200 that may be used in the wordline drivers 134 is shown in FIG. 2. The wordline driver 200 may include a transistor of a first type, such as a PMOS transistor 204, and a second PMOS transistor 208, coupled in parallel between a wordline supply node 210 and a row address node RAddr. The gate of the PMOS transistor 204 may receive an active low control voltage PCF. A PMOS transistor 214 may be coupled between the wordline supply node 210 and a wordline WL. The PMOS transistors 208, 214 may be cross-coupled in that the gate of each of the transistors 208, 214 may be coupled to the drain of the other. The wordline driver 200 may also include a transistor of a second type that is different from the first type, such as an NMOS transistor 218, coupled between the wordline WL and a power supply voltage, such as ground 220. The gate of the transistor 218 may be coupled to the row address node RAddr. Also shown in FIG. 2 are a pair of row address decode transistors, such as NMOS transistors 230, 234, coupled between the row address node RAddr and ground 220. The gates of the row address decode transistors 230, 234 may receive respective row address bit signals RA, RB, respectively. Although the row address decode transistors 230, 234 are shown as part of the wordline driver 200, they may instead be part of the row decoders 118 (FIG. 1) or some other component in the memory device 100 or some other memory device.

In operation, when the memory cell array 130 is inactive, all of the wordlines WL in the array 130 may be driven to a voltage, such as ground, that turns off all of the memory cell access transistors in the array 130. This may be accomplished by an active low control signal PcF being applied to the gate of the transistor 204, which may drive the gate of the NMOS transistor 218 high. The high gate voltage of the transistor 218 may turn it ON, thereby coupling the wordline WL to ground. When any row of memory cells in the array 130 is to be activated, the control signal PcF may be driven inactive high to turn OFF the transistor 204. If a row address is decoded so that RA and RB are both high, the row address decode transistors 230, 234 are turned ON to couple the row address node RAddr to ground. In such case, the PMOS transistor 214 may be turned ON to couple the wordline WL to the wordline supply node 210. A voltage VccGidl having a magnitude that is greater than the supply voltage $V_{CC}$ (FIG. 1) may be selectively provided to the wordline supply node 210, as explained in greater detail below. As a result, the wordlines WL in the array 130 may be driven to a voltage VccGidl having a sufficient magnitude to turn on the memory cell access transistors in the row to which the wordline WL is coupled. At the same time, the high voltage on the wordline WL may be applied to the gate of the PMOS transistor 208 to turn it OFF so that the row address node RAddr may be maintained at ground by the row address decode transistors 230, 234. As a result, the NMOS transistor 218 may be turned OFF to decouple the wordline WL from ground.

If the row address is not decoded so that RA and RB are either low, the row address node RAddr may be decoupled from ground so that it can be maintained at the high voltage it was when the control signal transitioned high to turn OFF the transistor 204. The high state of the row address node RAddr may be maintained because the ON state of the NMOS transistor 218 maintains the gate of the PMOS transistor 208 low to maintain the PMOS transistor 208 in a conductive state, thereby coupling the voltage VccGidl on the wordline supply node 210 to the row address node RAddr. The transistors 208, 214 are thus cross-coupled with each other to implement a latch.

The relatively high voltage that may be supplied to the wordline supply node 210 may exacerbate a phenomena known as gate-induced drain leakage ("GIDL"). As is known in the art, susceptibility to GIDL may arise when a transistor's gate overlies a diffusion region of the transistor, and a sufficient voltage differential between the gate and the diffusion region exists to create an electric field and resultant leakage current. This problem may be especially critical in view of the large number of wordline drivers that may be present in the memory device 100. To minimize GIDL, it is common for the VccGidl voltage applied to the wordline supply node 210 to be switched between two levels. More specifically, when the array is active 130, the wordline supply node 210 may be driven with a relatively high voltage so that the wordline WL will be able to supply a voltage to memory cell access transistors that is large enough for the access transistors to pass the full magnitude of the supply voltage $V_{CC}$ to respective memory cells. However, when the array is not active, the wordline supply node 210 may be driven with a relatively low voltage that is sufficient to turn ON the NMOS transistor 218 but low enough to reduce the effects of GIDL that might exist if the wordline supply node 210 continued to be driven with the relatively high voltage.

With further reference to FIG. 2, the VccpGidl voltage applied to the wordline supply node 210 may be switched between two levels using a wordline power circuit 240 formed by an inverter 242 driven by a common, active low control voltage GidlF. The inverter 242 may be formed by a transistor of a first type, such as a PMOS transistor 244, and a transistor of a second type that is different from the first type, such as an NMOS transistor 246. The PMOS transistor 244 may include a power input at its source that receives the voltage Vccp from the charge pump 160. When the control voltage GidlF is low, the PMOS transistor 244 may couple the voltage Vccp to the wordline supply node 210. On the other hand, when the control voltage GidlF is high, the NMOS transistor 246 may couple a second voltage, such as a common supply voltage CMNSupply, to the wordline supply node 210. In the row driver embodiment 200 shown in FIG. 2, the voltage CMNSupply may have a magnitude that is less than the magnitude of the voltage Vccp but sufficient to turn ON the NMOS transistor 218 when the transistor 204 or 208 is turned ON. The reduced magnitude of the voltage CMN-Supply compared to the voltage Vccp may minimize GIDL effects in the row driver 200.

One disadvantage of the row driver 200 shown in FIG. 2 and explained to this point is power that may be wasted when the wordline power circuit 240 switches to transition the wordline supply node 210 between the voltages CMNSupply and Vccp. More specifically, the wordline power circuit 240 may be coupled to row drivers for a large number of wordlines WL so that wordline supply node 210 coupling the wordline power circuit 240 to the transistors 204, 208, 214 may have a high degree of capacitance. Therefore, when the wordline supply node 210 is driven to the voltage Vccp, the capacitance of the line may be charged to this voltage. When the wordline supply node 210 is driven to the voltage CMNSupply, the line may be discharged to a CMNSupply node 256. This switching cycle effectively results in a net flow of current from the charge pump 160 to the CMNSupply node 256, thereby wasting power. Additionally, the PMOS transistor 244 and the NMOS transistor 246 may both be ON at the same time for a short period when the voltage on the wordline supply node 210 is being switched from one voltage to the other. As a result, additional current may flow from the charge pump 160 to the CMNSupply node 256.

Figure 3:
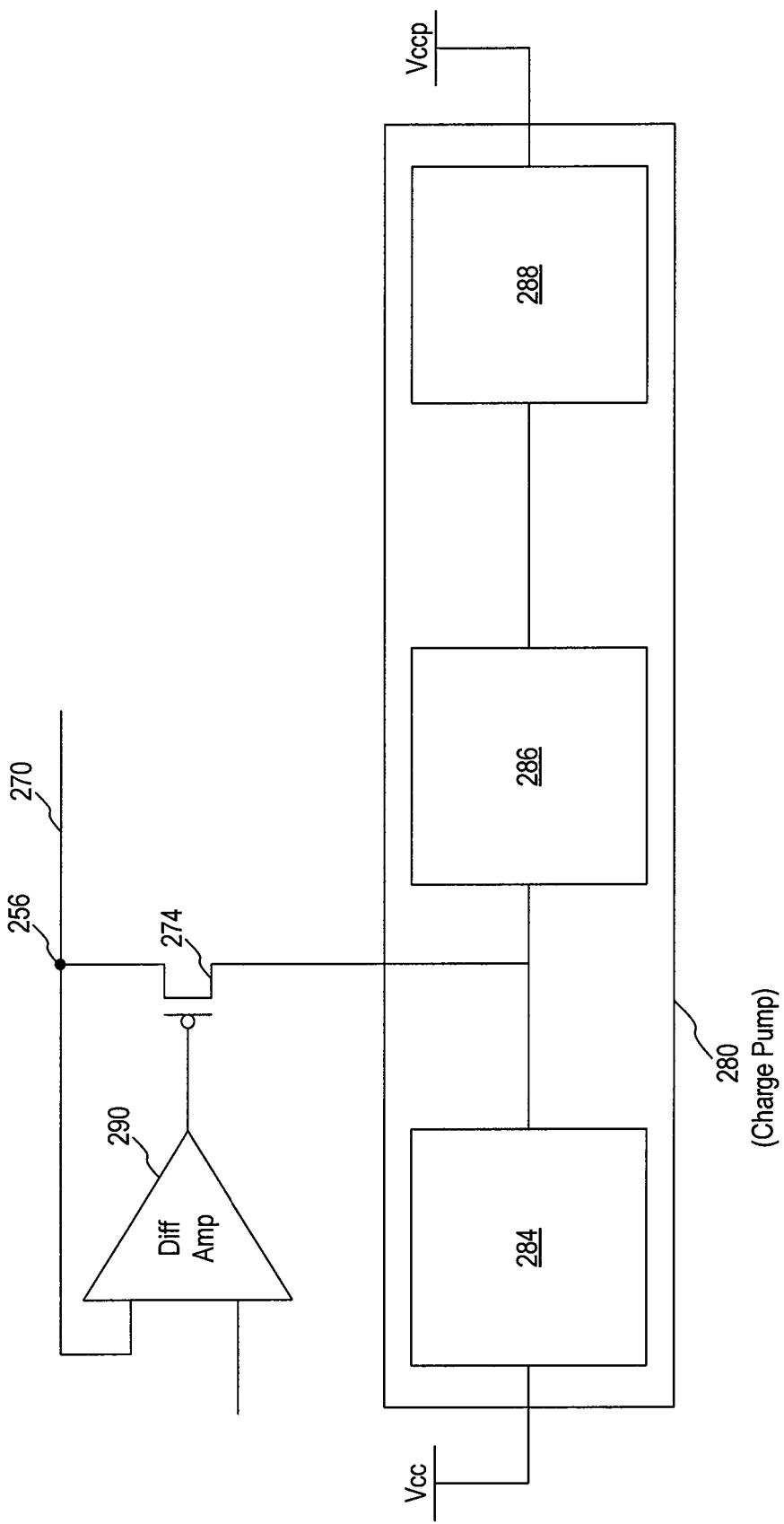
FIG. 3 is a block diagram and schematic diagram of an embodiment of a coupling circuit and charge pump that may be used in the memory device of FIG. 1.

The embodiment of the row driver 200 shown in FIG. 2 may substantially avoid wasting this power by using a coupling circuit to couple the CMNSupply node 256 to the charge pump 160 for at least some period of time so that the charge stored on the signal line 250 is discharged back to the charge pump 160. As shown in FIG. 3, a coupling circuit 270 may include a transistor of a first type, such as a PMOS transistor 274, coupled between Vccp and a charge pump 280. In one embodiment explained in greater detail below, the charge pump 280 may be composed of a plurality of stages, such as three stages 284, 286, 288, the first of which may be coupled to receive the supply voltage $V_{CC}$. The output of the first stage 284 may have a magnitude that is less than the magnitude of the common supply voltage CMNSupply when the transistor 246 turns on to transition the signal line 250 from Vccp to the common supply voltage CMNSupply. The CMNSupply node 256 may be coupled to the output of the first stage 284 through the PMOS transistor 274. The gate of the PMOS transistor 274 may be coupled to the output of a differential amplifier 290, which may have a first input receiving a reference voltage Ref and a second input coupled to the common supply voltage CMNSupply node 256.

In operation, when the transistor 246 (FIG. 2) turns on to transition the signal line 250 from Vccp to CMNSupply, the voltage of the line 250 and the wordline supply node 210 may remain an a level above the common supply voltage CMNSupply until the excess charge stored on the line 250 is discharged. As a result, when the transistor 246 is turned ON, the charge on the wordline supply node 210 and on line 250 at the voltage Vccp may be shared with the charge on the CMNSupply node 256 so that the magnitude of the voltage on the node 256 may initially be greater than the magnitude of the reference voltage Ref. The differential amplifier 290 may therefore drive its output low to turn ON the PMOS transistor 274 an allow the charge stored on the wordline supply node 210, the line 250, and the CMNSupply node 256 to be discharged into the second stage 286 of the charge pump 280. The wordline supply node 210, the line 250, and the node 256 may continue to be discharged into the second stage 286 until the voltage of the CMNSupply node 256 falls to the level of the reference voltage Ref. At that point, the output of the differential amplifier 290 may transition high to turn OFF the PMOS transistor 274 and isolate the CMNSupply node 270 from the charge pump 280. As a result, the charge stored on the wordline supply node 210 and the line 250 that might otherwise be discharged to ground and thereby wasted may be discharged into a circuit that may subsequently use such charge.

Although the embodiment is explained in the context of a memory device wordline driver, in other embodiments other memory device components and components in devices other than memory devices that have a signal line transitioning between two binary voltages may be configured to avoid wasting charge in a similar manner. Therefore, although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

I claim:

1. An apparatus, comprising:
a signal line;
a driver having an output coupled to the signal line, the driver being configured to selectively drive the signal line between a first voltage and a second voltage that is different from the first voltage;
a charge pump; and
a coupling circuit coupled between the signal line and the charge pump, the coupling circuit being configured to transfer electrical charge from the signal line to the charge pump responsive to the signal line being driven from the first voltage to the second voltage.

2. The apparatus of claim 1 wherein the driver circuit includes a power input and is configured to receive power from the charge pump.

3. The apparatus of claim 1 wherein the coupling circuit coupled is configured to selectively couple the signal line to the charge pump responsive to the signal line being at a voltage having a particular magnitude that is between the first voltage and the second voltage.

4. The apparatus of claim 1 wherein the charge pump comprises a plurality of charge pump stages, and wherein the coupling circuit is coupled between the signal line and a connection between one of the stages of the charge pump and another of the stages of the charge pump.

5. The apparatus of claim 1 wherein the driver comprises an inverter.

6. The apparatus of claim 1 wherein the coupling circuit comprises:
a transistor having a gate and a source and a drain coupled between the signal line and the charge pump; and
a differential amplifier having a first input coupled to receive a reference voltage, a second input coupled to receive a voltage corresponding to the first voltage, and an output coupled to the gate of the transistor.

7. The apparatus of claim 6 wherein the reference voltage has a magnitude that causes the differential amplifier to render the transistor conductive responsive to the magnitude of the first voltage exceeding the magnitude of the reference voltage.

8. The apparatus of claim 1 wherein the charge pump comprises a plurality of charge pump stages coupled to each other in series between a power input and a charge pump output, and wherein a final one of the charge pump stages is coupled to the charge pump output is configured to generate the first voltage.

9. The apparatus of claim 8 wherein one of the charge pump stages other than the final charge pump stage is configured to generate the second voltage.

10. A memory device receiving a supply voltage, the memory device comprising:
    an array of memory cells, comprising:
        a plurality of memory cells, and
        a plurality of wordlines coupled to respective sets of the plurality of memory cells;
    a charge pump configured to generate a pumped voltage having a magnitude that is greater than a magnitude of the supply voltage;
    a wordline power circuit configured to receive the pumped voltage and a common supply voltage having a magnitude that is less than a magnitude of the pumped voltage, the wordline power circuit being configured to selectively couple either the pumped voltage or the common supply voltage to a wordline supply node;
    a wordline driver having a plurality of wordline circuits, each of the wordline circuits being coupled to a respective one of the wordlines, each of the wordline circuits being configured to selectively couple the wordline supply node to a respective one of the plurality of the wordlines; and
    a coupling circuit coupled between the wordline supply node and the charge pump, the coupling circuit being configured to selectively transfer electrical charge from the wordline supply node to the charge pump responsive to the wordline supply node being at a voltage having a magnitude that is between the magnitude of the common supply voltage and the magnitude of the pumped voltage.

11. The memory device of claim 10 wherein the charge pump comprises a plurality of charge pump stages, and wherein the coupling circuit is coupled between the wordline supply node and a connection between one of the stages of the charge pump and another of the stages of the charge pump.

12. The memory device of claim 10 wherein the wordline power circuit comprises an inverter having a first supply terminal coupled to receive the pumped voltage and a second supply terminal coupled to receive the common supply voltage.

13. The memory device of claim 10 wherein each of the wordline circuits includes at least one transistor that is susceptible to gate-induced diode leakage, and wherein the gate-induced diode leakage of the at least one transistor is substantially lower when the wordline power circuit is coupling the common supply voltage to the wordline supply node compared to the gate-induced diode leakage of the at least one transistor when the wordline power circuit is coupling the pumped voltage to the wordline supply node.

14. The memory device of claim 10 wherein the coupling circuit comprises:
    a transistor having a gate and a source and a drain coupled between the wordline supply node and the charge pump; and
    a differential amplifier having a first input coupled to receive a reference voltage, a second input coupled to receive the common supply voltage, and an output coupled to the gate of the transistor.

15. The memory device of claim 14 wherein the reference voltage has a magnitude that causes the differential amplifier to render the transistor conductive responsive to the magnitude a voltage of the wordline supply node exceeding the magnitude of the reference voltage.

16. The memory device of claim 10 wherein the charge pump is configured to generate the common supply voltage.

17. The memory device of claim 10 wherein the memory device comprises a dynamic random access memory device.

18. The memory device of claim 10 wherein each of the wordline circuits comprise:
    first and second transistors cross-coupled to each other, each of the first and second transistors having one of a source and a drain coupled to the wordline supply node, the first transistor having a gate coupled to the respective one of the wordlines and the other of the source and the drain coupled to a wordline control node, the second transistor having a gate coupled to the wordline control node and the other of the source and the drain coupled to the respective one of the wordlines; and
    a third transistor having one of a source and a drain coupled between the respective one of the wordlines and a second supply node and a gate coupled to the wordline control node.

19. The memory device of claim 10 wherein the memory device is configured to receive a having a plurality of row address signals, and wherein each of the wordline circuits is configured to selectively couple the wordline supply node to the respective one of the plurality of the wordlines responsive to the memory device receiving a having a particular combination of the plurality of row address signals.

20. A method of reducing power consumption of a charge pump coupled to supply power to a driver having an output coupled to a signal line, the method comprising transferring electrical charge from the signal line to the charge pump responsive to the signal line being driven from a first voltage to a second voltage that is different from the first voltage.

21. The method of claim 20 wherein the charge pump comprises a plurality of charge pump stages, and wherein the act of selectively coupling the signal line to the charge pump comprises selectively coupling the signal line to a connection between one of the stages of the charge pump and another of the stages of the charge pump.

22. The method of claim 20 wherein the driver comprises a first power supply terminal coupled to receive the first voltage from the charge pump and a second power supply terminal coupled to receive the second voltage.

23. The method of claim 20 wherein the act of selectively coupling the signal line to the charge pump comprises coupling the signal line to the charge pump through a transistor, and wherein the act of selectively coupling the signal line to the charge pump comprises rendering the transistor conductive responsive to the signal line being at a voltage that is greater than the second voltage.

* * * * *